US012142506B2

(12) United States Patent
Sakaue et al.

(10) Patent No.: US 12,142,506 B2
(45) Date of Patent: Nov. 12, 2024

(54) SUBSTRATE TRANSFER APPARATUS, SUBSTRATE PROCESSING SYSTEM AND SUBSTRATE PROCESSING METHOD

(71) Applicant: TOKYO ELECTRON LIMITED, Tokyo (JP)

(72) Inventors: Hiromitsu Sakaue, Yamanashi (JP); Toshiaki Kodama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 462 days.

(21) Appl. No.: 17/553,158

(22) Filed: Dec. 16, 2021

(65) Prior Publication Data
US 2022/0199442 A1    Jun. 23, 2022

(30) Foreign Application Priority Data

Dec. 22, 2020  (JP) .................................. 2020-212876

(51) Int. Cl.
*H01L 21/677* (2006.01)
*G01N 21/95* (2006.01)

(52) U.S. Cl.
CPC ... *H01L 21/67742* (2013.01); *G01N 21/9503* (2013.01); *H01L 21/67781* (2013.01)

(58) Field of Classification Search
CPC .......... G01N 21/9503; H01L 21/67259; H01L 21/67742; H01L 21/67754; H01L 21/67781
See application file for complete search history.

(56) References Cited

U.S. PATENT DOCUMENTS

| 8,781,787 | B2 | 7/2014 | Hayashi et al. |
| 10,933,532 | B2 | 3/2021 | Sugahara et al. |
| 11,518,038 | B2 | 12/2022 | Sugahara et al. |
| 2012/0046904 | A1 | 2/2012 | Hayashi et al. |
| 2018/0029237 | A1 | 2/2018 | Sugawara et al. |
| 2021/0138658 | A1 | 5/2021 | Sugahara et al. |
| 2022/0172967 | A1* | 6/2022 | Topping ............ H01L 21/67196 |

FOREIGN PATENT DOCUMENTS

| JP | 2002-124556 A | 4/2002 |
| JP | 2017-108063 A | 6/2017 |
| KR | 10-2017-0113666 A | 10/2017 |
| KR | 10-2018-0094505 A | 8/2018 |

* cited by examiner

*Primary Examiner* — Jaime Figueroa
*Assistant Examiner* — Zachary Joseph Wallace
(74) *Attorney, Agent, or Firm* — Fenwick & West LLP

(57) ABSTRACT

The present disclosure relates to a substrate transfer apparatus for transferring a substrate to a substrate processing apparatus in a reduced pressure atmosphere. The apparatus comprises a substrate holder to hold the substrate; and a substrate measurer, provided on the substrate holder, to measure a position of the substrate with respect to the substrate holder.

19 Claims, 7 Drawing Sheets

FIG.6

| STEP | Target Module | Presence or Absence of Wafer FORK130 | Presence or Absence of Wafer FORK140 | Operation | FORK130 Wafer Sensor132 Presence or Absence Determination | FORK130 Wafer Sensor132 Position Determination | FORK130 Stage Sensor133 Stage Position Determination | FORK140 Wafer Sensor142 Presence or Absence Determination | FORK140 Wafer Sensor142 Position Determination | FORK140 Stage Sensor143 Stage Position Determination |
|---|---|---|---|---|---|---|---|---|---|---|
| S1 | LLM20a | X | O | FORK 130 Extend End | | | O | | | |
| S2 | LLM20a | X | O | Correction Operation of FORK 130 | | | | | | |
| S3 | LLM20a | O | O | FORK 130 Wafer Get End | O | O | | | O | |
| S4 | LLM20a | O | O | FORK 130 Retract End | O | O | | | O | |
| S5 | LLM20a | O | O | FORK Change 130 to 140 | O | O | | | O | |
| S6 | LLM20a | O | O | FORK 140 Extend End | O | O | | O | O | O |
| S7 | LLM20a | O | X | Correction Operation of FORK 140 | O | O | | O | | |
| S8 | LLM20a | O | X | FORK 140 Wafer Put End | O | O | | | | |
| S9 | LLM20a | O | X | FORK 140 Retract End | O | O | | | | |
| S10 | VTM40 | O | X | LLM20a → PM41 | O | O | | | | |
| S11 | PM41 | O | O | FORK 140 Extend End | O | O | | | | O |
| S12 | PM41 | O | O | Correction Operation of FORK 140 | O | O | | | | |
| S13 | PM41 | O | O | FORK 140 Wafer Get End | O | O | | O | O | |
| S14 | PM41 | O | O | FORK 140 Retract End | O | O | | O | O | |
| S15 | PM41 | O | O | FORK Change 140 to 130 | O | O | | O | O | |
| S16 | PM41 | O | O | FORK 130 Extend End | O | | O | O | O | |
| S17 | PM41 | O | O | Correction Operation of FORK 130 | O | | | O | O | |
| S18 | PM41 | O | O | FORK 130 Wafer Put End | | | | O | O | |
| S19 | PM41 | X | O | FORK 130 Retract End | | | | O | O | |
| S20 | VTM40 | X | O | PM41 → LLM20b | | | | O | O | |

SUBSTRATE TRANSFER APPARATUS, SUBSTRATE PROCESSING SYSTEM AND SUBSTRATE PROCESSING METHOD

CROSS-REFERENCE TO RELATED APPLICATIONS

This application claims priority to Japanese Patent Application No. 2020-212876 filed on Dec. 22, 2020, the entire contents of which are incorporated herein by reference.

TECHNICAL FIELD

The present disclosure relates to a substrate transfer apparatus, a substrate processing system, and a substrate processing method.

BACKGROUND

Japanese Patent Application Publication No. 2017-108063 discloses a substrate processing apparatus including a transfer module which transfers a wafer and a process module which processes the wafer. A connective hole which connects the inside of the transfer module with the inside of the process module is provided in the wall of the transfer module. A sensor which detects an edge portion of the wafer is disposed at the connective hole.

SUMMARY

A technology according to the present disclosure makes it possible to always monitor the position of a substrate in a substrate transfer apparatus which transfers the substrate in a reduced pressure atmosphere.

In accordance with an aspect of the present disclosure, there is provided a substrate transfer apparatus for transferring a substrate to a substrate processing apparatus in a reduced pressure atmosphere. The apparatus comprises: a substrate holder to hold the substrate; and a substrate measurer, provided on the substrate holder, to measure a position of the substrate with respect to the substrate holder.

BRIEF DESCRIPTION OF THE DRAWINGS

FIG. 6 is an explanatory diagram illustrating an example of an operation flow of the wafer transfer apparatus.

DETAILED DESCRIPTION

Figure 1:
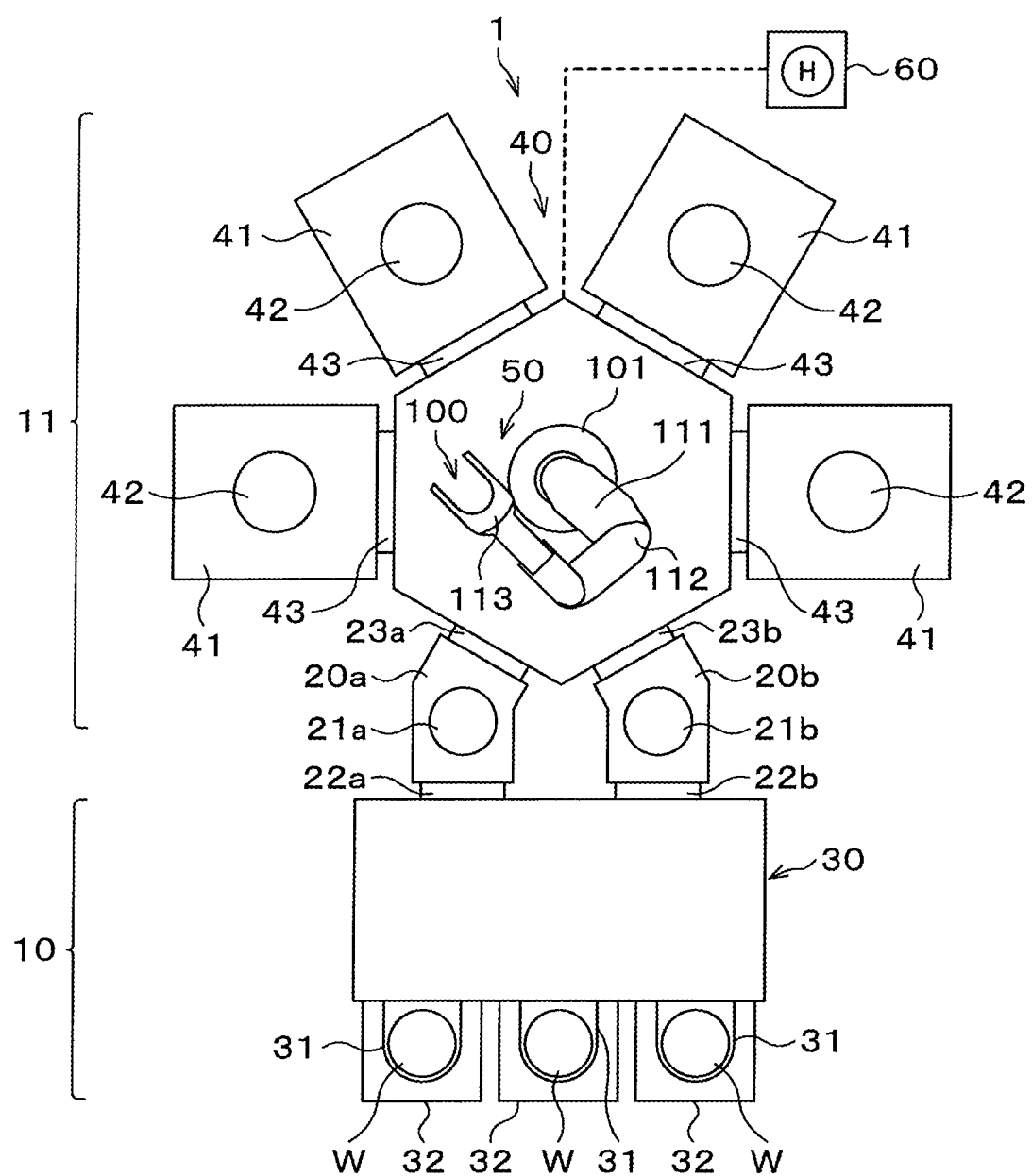
FIG. 1 is a plan view illustrating an outline of a configuration of a wafer processing system.

In a semiconductor device manufacturing process, various types of processes such as film formation processing and etching processes are performed on a semiconductor wafer (a substrate; hereinafter, referred to as a "wafer") in a reduced pressure atmosphere (vacuum atmosphere). When the various types of processes are performed, a so-called cluster-type wafer processing system in which a plurality of processing modules are connected around a transfer module having a wafer transfer apparatus therein is used. Then, the wafer is transferred toward each of the processing modules using the wafer transfer apparatus in the transfer module, and the wafer is subjected to a desired process.

Here, for example, when the wafer is not mounted at an appropriate position with respect to a stage of the processing module, the desired process cannot be performed on the wafer. Therefore, it is necessary that the wafer is held at an appropriate position in a transfer arm of the wafer transfer apparatus and the wafer is also transferred from the transfer arm to the desired position on the stage.

Regarding this point, in the substrate processing apparatus (the wafer processing system) disclosed in Japanese Patent Application Publication No. 2017-108063, a sensor which detects the edge portion of the wafer is disposed at the connective hole which connects the inside of the transfer module with the inside of the process module (the processing module). Then, when the wafer held by the transfer arm is loaded into the process module through the connective hole, the position of the edge portion of the wafer is specified by the sensor, and a center position of the wafer is specified. After that, the position of the wafer is corrected based on a deviation between the specified center position of the wafer and the desired center position of the wafer. In this way, the wafer is transferred to the desired position on the stage of the process module.

However, in the wafer transfer apparatus, it is also necessary to hold the wafer at an appropriate position in the transfer arm in order to suppress, for example, transfer failure, even for the case other than transferring the wafer to the processing module. Therefore, it is preferable to always monitor the wafer while the wafer is being transferred by the wafer transfer apparatus. However, in the substrate processing apparatus disclosed in Japanese Patent Application Publication No. 2017-108063, the position of the wafer can only be measured when the wafer passes through the connective hole, and thus, the position of the wafer cannot be measured except when the wafer passes through the connective hole. Therefore, there is room for improvement in the conventional wafer transfer apparatus.

The technology according to the present disclosure enables the substrate transfer apparatus which transfers a substrate in a reduced pressure atmosphere to always monitor the position of the substrate. Hereinafter, a wafer transfer apparatus as a substrate transfer apparatus, a wafer processing system as a substrate processing system, and a wafer processing method as a substrate processing method according to the present embodiment will be described with reference to the accompanying drawings. In the specification and the drawings, elements having substantially the same functional configuration are designated by the same reference numerals, and duplicate description thereof will be omitted.

<Configuration of Wafer Processing System>

First, a configuration of the wafer processing system according to the present embodiment will be described. FIG. 1 is a plan view illustrating an outline of the configuration of the wafer processing system 1. In the wafer processing system 1, a desired process such as a film forming process or an etching process is performed on the wafer W as a substrate under a reduced pressure atmosphere (a vacuum atmosphere). The configuration of the wafer processing system 1 of the present disclosure is not limited thereto and can be arbitrarily selected.

As illustrated in FIG. 1, the wafer processing system 1 has a configuration in which an atmospheric pressure part 10 and a reduced pressure part 11 are integrally connected via load lock modules 20a and 20b. Loading and unloading of a hoop 31, which will be described below, capable of accommodating a plurality of wafers W in a normal pressure atmosphere (atmospheric atmosphere) are performed in the atmospheric pressure part 10, and the wafer W is transferred to the load lock modules 20a and 20b. In the reduced pressure part 11, the wafer W is subjected to a desired process under a reduced pressure atmosphere (a vacuum atmosphere), and the wafer W is further transferred to the load lock modules 20a and 20b.

A stage 21a on which the wafer W is mounted is provided inside the load lock module 20a. The load lock module 20a temporarily holds the wafer W on the stage 21a in order to deliver the wafer W transferred from a loader module 30, which will be described below, in the atmospheric pressure part 10 to a transfer module 40, which will be described below, in the reduced pressure part 11.

The load lock module 20a is connected to the loader module 30, which will be described below, via a gate valve 22a. Further, the load lock module 20a is connected to the transfer module 40, which will be described below, via a gate valve 23a. The gate valves 22a and 23a ensure airtightness between the load lock module 20a, the loader module 30 and the transfer module 40 and allow mutual connective with among them.

An air supply (not illustrated) for supplying gas and an exhauster (not illustrated) for discharging gas are connected to the load lock module 20a, and the inside of the load lock module 20a is switchable between an atmospheric pressure atmosphere and a reduced pressure atmosphere by the air supply and the exhauster. That is, the load lock module 20a is configured so that the wafer W can be appropriately delivered between the atmospheric pressure part 10 in the atmospheric pressure atmosphere and the reduced pressure part 11 in the reduced pressure atmosphere.

The load lock module 20b has the same configuration as the load lock module 20a. That is, the load lock module 20b includes a stage 21b on which the wafer W is mounted, a gate valve 22b on the loader module 30 side, and a gate valve 23b on the transfer module 40 side.

The number and arrangement of the load lock modules 20a and 20b are not limited to the present embodiment and can be set arbitrarily.

The atmospheric pressure part 10 includes a loader module 30 provided with a wafer transfer apparatus (not illustrated), and a load port 32 on which a hoop 31 capable of storing a plurality of wafers W is mounted. The loader module 30 is also referred to as an equipment front end module (EFEM).

The loader module 30 has a housing of which the inside has a rectangular shape, and the inside of the housing is maintained in an atmospheric pressure atmosphere. A plurality of, for example, three, load ports 32 are arranged side by side on a side surface forming a long side of the housing of the loader module 30. The load lock modules 20a and 20b are arranged side by side on the other side surface forming a long side of the housing of the loader module 30. Further, the loader module 30 has the wafer transfer apparatus (not illustrated), which can move in a longitudinal direction, inside the housing. The wafer transfer apparatus can transfer the wafer W between the hoop 31 mounted on the load port 32 and the load lock modules 20a and 20b.

The number and arrangement of the load ports 32 are not limited to the present embodiment and can be arbitrarily designed. Further, a processing module which performs a desired process on the wafer W under the atmospheric pressure atmosphere, for example, a module which performs an alignment process for adjusting a horizontal direction of the wafer W may be provided in the atmospheric pressure part 10.

The hoop 31 accommodates a plurality of wafers W, for example, 25 wafers per lot, to be overlapped and stacked in multiple stages at equal intervals. Further, the inside of the hoop 31 mounted on the load port 32 is filled with, for example, air, nitrogen gas or the like and is sealed.

The reduced pressure part 11 comprises a transfer module 40 which transfers the wafer W, and a processing module 41 as a substrate processing apparatus which performs a desired process on the wafer W. Each of the inside of the transfer module 40 and the inside of the processing module 41 are maintained in a reduced pressure atmosphere. A plurality of processing modules 41, for example, four are provided for a transfer module 40. The transfer module 40 is also referred to as a vacuum transfer module (VTM).

The transfer module 40 has a housing of which the inside has a polygonal shape, a hexagonal shape in the illustrated example, and is connected to the load lock modules 20a and 20b via gate valves 23a and 23b as described above. That is, the load lock modules 20a and 20b and four processing modules 41 are disposed on side surfaces of the transfer module 40, respectively. Then, the transfer module 40 transfers the wafer W loaded into the load lock module 20a to one processing module 41, performs a desired processing, and then carries the processed wafer out to the atmospheric pressure part 10 via the load lock module 20b.

A wafer transfer apparatus 50 which transfers the wafer W to the processing module 41 is provided inside the transfer module 40. A detailed configuration of this wafer transfer apparatus 50 will be described below.

A stage 42 on which the wafer W is mounted is provided inside the processing module 41. The processing module 41 performs a desired process such as a film forming process or an etching process on the wafer W mounted on the stage 42. The processing module 41 is connected to an air supply (not illustrated) which supplies a processing gas, a purge gas, or the like, and an exhauster (not illustrated) which discharges gas.

Further, the processing module 41 is connected to the transfer module 40 via a gate valve 43. The gate valve 43 ensures airtightness between the transfer module 40 and the processing module 41 and allows connectivity between each other.

The number and arrangement of the processing modules 41 provided in the transfer module 40 and the type of processing of the processing module 41 are not limited to the present embodiment and can be set arbitrarily.

A controller 60 is provided in the wafer processing system 1 described above. The controller 60 is, for example, a computer equipped with a CPU, a memory, and the like and has a program storage part (not illustrated). The program storage part stores a program which controls the process of the wafer W in the wafer processing system 1. The program may be recorded on a computer-readable storage medium H and may be installed in the controller 60 from the storage medium H.

<Wafer Processing in Wafer Processing System>

The wafer processing system 1 according to the present embodiment is configured as described above. Next, the wafer processing in the wafer processing system 1 will be described.

First, the hoop 31 in which the plurality of wafers W are accommodated is mounted on the load port 32.

Next, the wafer W is taken out from the hoop 31 by the wafer transfer apparatus (not illustrated) and loaded into the load lock module 20a. When the wafer W is loaded into the load lock module 20a and mounted on the stage 21a, the gate valve 22a is closed, and the inside of the load lock module 20a is sealed and a pressure thereof is decreased. After that, the gate valve 23a is opened, and the inside of the load lock module 20a and the inside of the transfer module 40 are connected to each other.

Next, when the load lock module 20a and the transfer module 40 are connected to each other, the wafer W is taken out by the wafer transfer apparatus 50 and loaded into the transfer module 40 from the load lock module 20a.

Next, the gate valve 43 is opened, and the wafer W is loaded into the processing module 41 by the wafer transfer apparatus 50 and mounted on the stage 42. Subsequently, the gate valve 43 is closed, and a desired process is performed on the wafer W. When the process is completed, the gate valve 43 is opened, and the wafer W is unloaded from the processing module 41 by the wafer transfer apparatus 50. Then, the gate valve 43 is closed.

Next, the gate valve 23b is opened, and the wafer W is loaded into the load lock module 20b by the wafer transfer apparatus 50. When the wafer W is loaded into the load lock module 20b and mounted on the stage 21b, the gate valve 23b is closed, and the inside of the load lock module 20b is sealed and is then opened to the atmosphere.

Next, the wafer W is returned to and accommodated in the hoop 31 by the wafer transfer apparatus (not illustrated). In this way, a series of processes on a wafer in the wafer processing system 1 is completed.

In the present embodiment, the unprocessed wafer W is transferred to the load lock module 20a, and the processed wafer W is transferred to the load lock module 20b, but a destination of the wafer W may be either one. For example, the unprocessed wafer W may be transferred to the load lock module 20b, and the processed wafer W may be transferred to the load lock module 20a. Alternatively, for example, the unprocessed wafer W may be taken out of the load lock module 20a, and the processed wafer W may be loaded into the load lock module 20a.

<Configuration of Wafer Transfer Apparatus>

Figure 2:
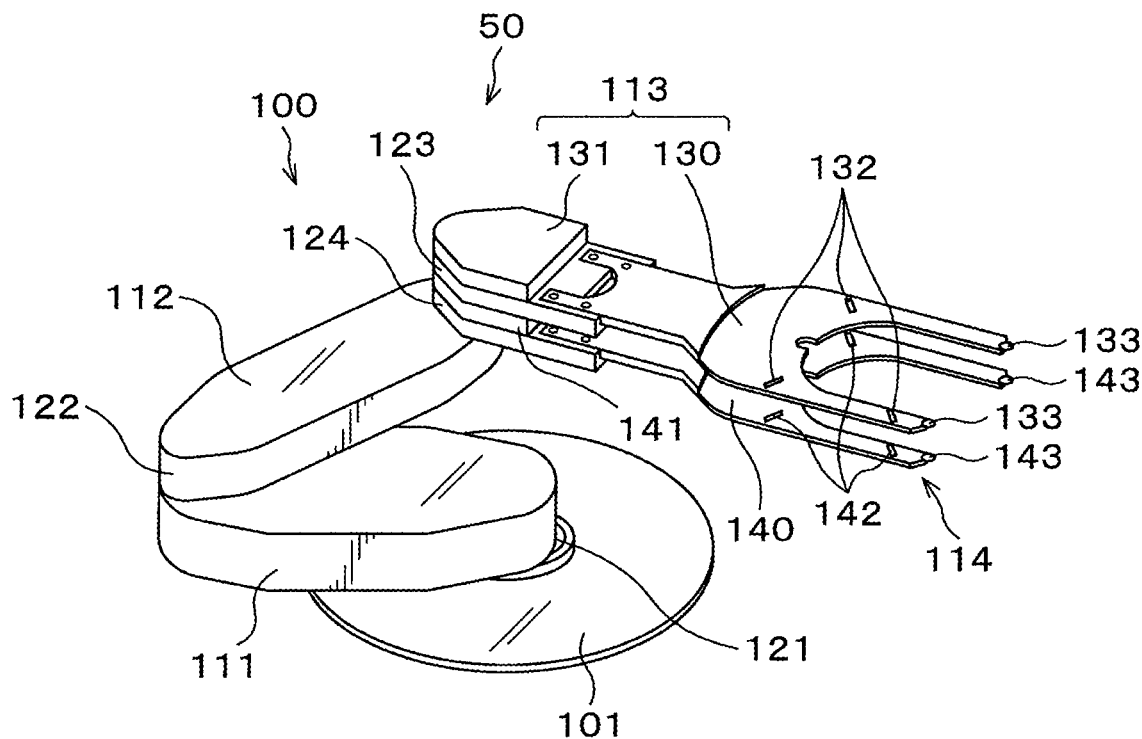
FIG. 2 is a perspective view illustrating an outline of a configuration of a wafer transfer apparatus.
Figure 3:
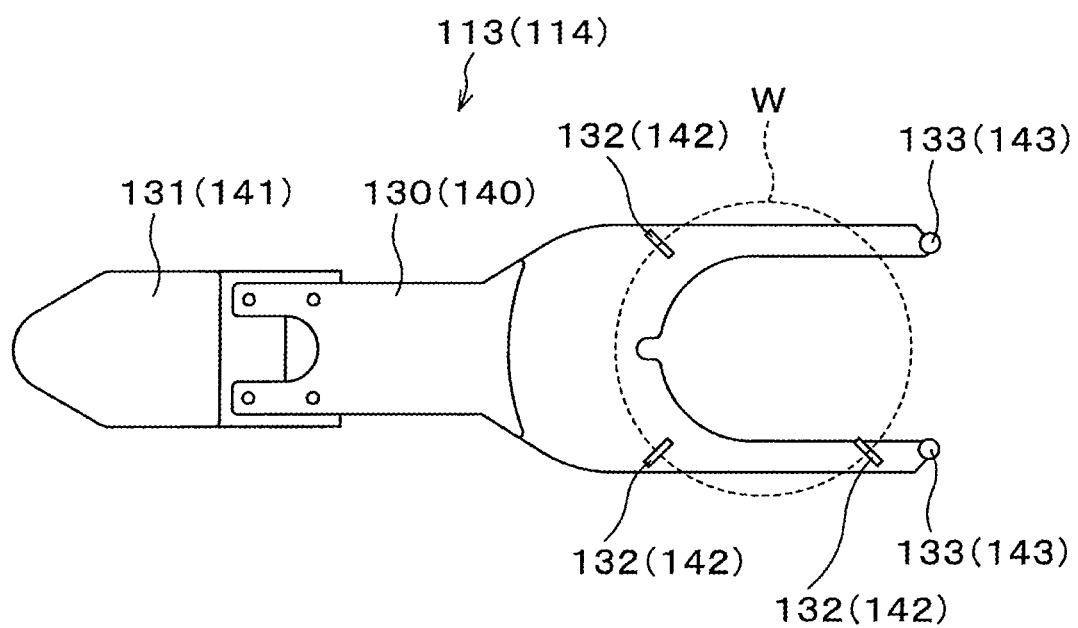
FIG. 3 is a plan view of a third arm and a fourth arm.
Figure 4:
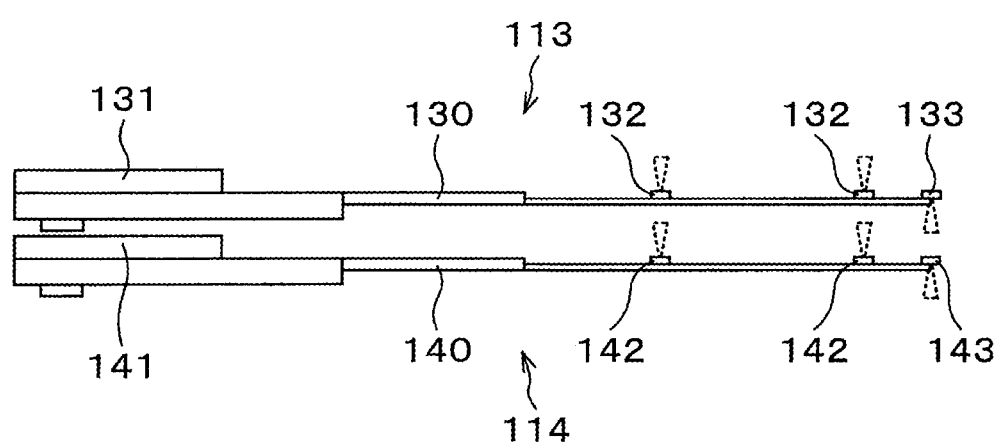
FIG. 4 is a side view of the third arm and the fourth arm.

Next, a configuration of the wafer transfer apparatus 50 described above will be described. FIG. 2 is a perspective view illustrating an outline of the configuration of the wafer transfer apparatus 50. FIG. 3 is a plan view of a third arm 113 and a fourth arm 114 which will be described below, and FIG. 4 is a side view of the third arm 113 and the fourth arm 114 which will be described below.

As illustrated in FIG. 2, the wafer transfer apparatus 50 includes a transfer arm 100 which holds and moves the wafer, and a base 101 which supports the transfer arm 100. A drive mechanism (not illustrated) which drives lifting/lowering and rotating of the transfer arm 100 is provided on the base 101. The drive mechanism includes an actuator such as a motor which generates a driving force for lifting and lowering the transfer arm 100 and a driving force for horizontally rotating the transfer arm 100.

The transfer arm 100 is an articulated arm and has a linked arm structure in which a plurality of, for example, four, arms 111, 112, 113, and 114 are connected to each other.

A proximal end of the first arm 111 is connected to the base 101, and a distal end thereof is connected to the second arm 112. A proximal end of the second arm 112 is connected to the first arm 111, and a distal end thereof is connected to the third arm 113 and the fourth arm 114. Proximal ends of the third arm 113 and the fourth arm 114 are connected respectively to the second arm 112. The third arm 113 is provided above the fourth arm 114.

A first joint 121 is provided between the proximal end of the first arm 111 and the base 101. A second joint 122 is provided between the proximal end of the second arm 112 and the distal end of the first arm 111. A third joint 123 is provided between the proximal end of the third arm 113 and the distal end of the second arm 112. A fourth joint 124 is provided between the proximal end of the fourth arm 114 and the distal end of the second arm 112. The third joint 123 and the fourth joint 124 are provided at the same position in a plan view. A drive mechanism (not illustrated) is provided inside each of the joints 121, 122, 123, and 124. Each of the arms 111, 112, 113, and 114 is configured to be rotatable (turnable) having the joints 121, 122, 123, and 124 in the center by the drive mechanism.

A hollow portion having an atmospheric pressure atmosphere is formed inside each of the first arm 111 and the second arm 112. Various parts are accommodated in each of the hollow portions. For example, cables (not illustrated) connected to wafer measurers 132 and 142 which will be described below, and cables (not illustrated) connected to stage measurers 133 and 143 are accommodated therein. Further, for example, a motor (not illustrated) for driving the drive mechanism of each of the joints 121, 122, 123, and 124 and a cable (not illustrated) connected to the motor are accommodated therein. Further, for example, a vibration meter (not illustrated) for measuring the vibration of the transfer arm 100 and a thermometer (not illustrated) for measuring the temperature of the transfer arm 100 are accommodated therein. Furthermore, for example, an air supply (not illustrated) for supplying clean dry air to the hollow portions of the first arm 111 and the second arm 112 is accommodated therein. These parts are not exposed to the outside of the arm. Therefore, since each of the parts is prevented from being damaged or worn by a corrosive atmosphere, it is not necessary to separately prepare a cable duct or the like for covering the parts outside the wafer transfer apparatus 50.

The third arm 113 includes a fork 130 (an end effector) which is a substrate holder and a hand 131 which supports the fork 130. The fork 130 is provided on the distal end side of the third arm 113, and a proximal end thereof is installed at the hand 131. The fork 130 has a bifurcated shape having the distal end thereof branched off into two portions. A plurality of pads (not illustrated) are provided on an upper surface of the fork 130, and the fork 130 adheres and holds the wafer W using the plurality of pads. The hand 131 is provided on the proximal end side of the third arm 113 and is installed at the third joint 123. The shape of the fork 130 is not limited to the present embodiment and may be, for example, a flat plate shape.

A wafer measurer 132 as a substrate measurer for measuring a position of the wafer W is provided on the fork 130. For example, a complementary metal-oxide semiconductor (CMOS) line sensor is used in the wafer measurer 132 to measure a distance from the wafer measurer 132 to the wafer W. A plurality of, for example, three, wafer measurers 132 are provided on the upper surface of the fork 130. The arrangement of the three wafer measurers 132 is not particularly limited, but in the illustrated example, two wafer measurers 132 are provided at a proximal end of the branched portion of the fork 130, and one wafer measurer 132 is provided in the vicinity of a distal end of the branched portion of the fork 130. Measurement results of the three wafer measurers 132 are output to the controller 60 by, for example, wireless communication or wired communication. The controller 60 calculates a center position of the wafer W with respect to the fork 130 based on the measurement results of the three wafer measurers 132. Further, the controller 60 can also detect the presence or absence of the wafer W in the fork 130 based on the measurement results of the three wafer measurers 132.

The cable (not illustrated) connected to the wafer measurer 132 is disposed in the hollow portion of the first arm 111 and the hollow portion of the second arm 112 as described above and is also embedded inside the third arm 113. Therefore, the cable is not exposed to the outside of the arm.

The number of wafer measurers 132 is not limited to the present embodiment. For example, when a diameter of the wafer W is known in advance, the number of wafer measurers 132 may be two. In such a case, the controller 60 can calculate the center position of the wafer W based on the measurement results of the two wafer measurers 132 and the diameter of the wafer W.

Further, for example, when the alignment process for adjusting the horizontal orientation of the wafer W is not performed in the atmospheric pressure part 10, there may be four wafer measurers 132. When the alignment processing is not performed, the wafer measurer 132 may be stuck in a notch portion of the wafer W, and the wafer measurer 132 may not be able to detect the wafer W. Therefore, in such a case, there may be four wafer measurers 132.

A stage measurer 133 for measuring positions of the stages 21a and 21b of the load lock modules 20a and 20b and the stage 42 of the processing module 41 is provided in the fork 130. For example, a white confocal displacement sensor is used in the stage measurer 133 to measure distances from the stage measurer 133 to the stages 21a, 21b, and 42. Two stage measurers 133 are provided at distal ends of the two branched portions of the fork 130.

A cable (not illustrated) connected to the stage measurer 133 is disposed in the hollow portion of the first arm 111 and the hollow portion of the second arm 112 as described above and is also embedded inside the third arm 113. Therefore, the cable is not exposed to the outside of the arm.

Figure 5:
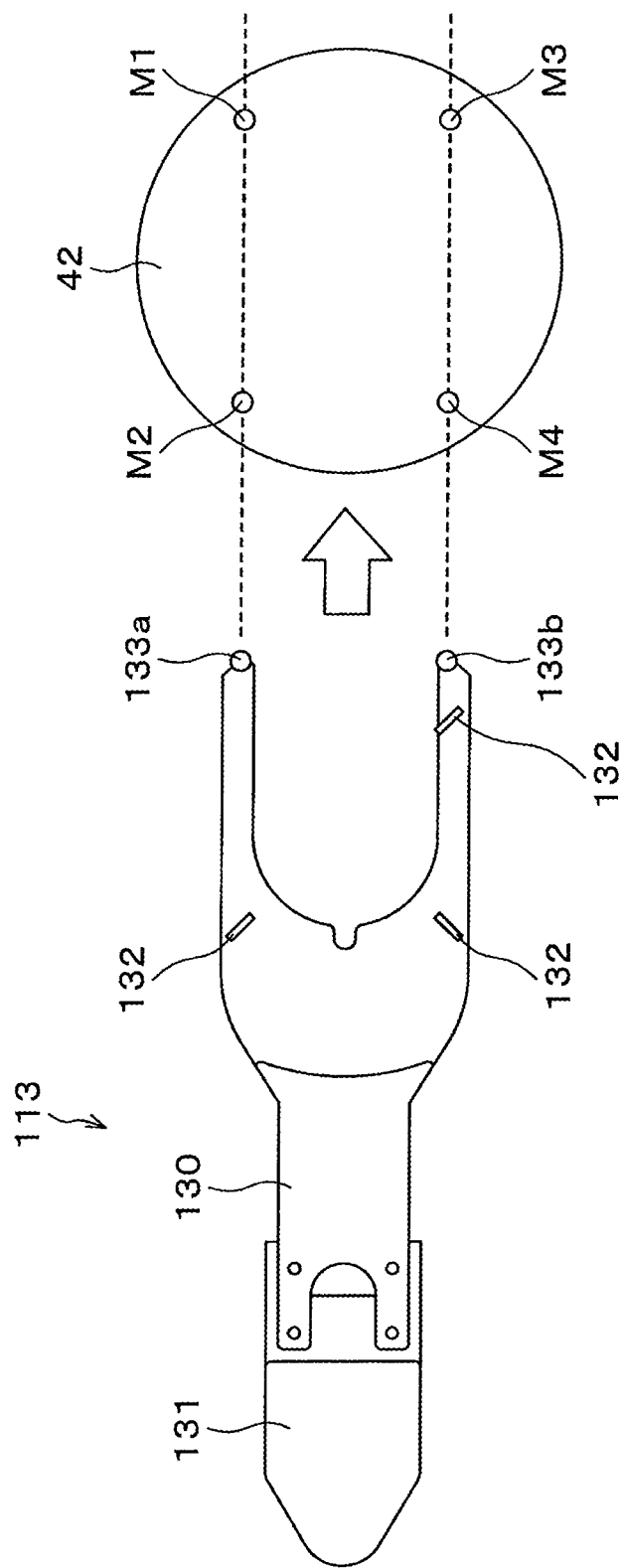
FIG. 5 is an explanatory diagram illustrating a state in which a stage measurer measures a position of a stage.

FIG. 5 is an explanatory diagram illustrating a state in which the position of the stage 42 is measured by the stage measurer 133. Two stage measurers 133a and 133b measure distances from the upper surface of the stage 42 to four measurement points M1 to M4 of the stage 42. The measurement points M1 and M2 are measurement points provided side by side in a moving direction of the stage measurer 133a, and the measurement points M3 and M4 are measurement points provided side by side in a moving direction of the stage measurer 133b. Then, while the fork 130 is moved with respect to the stage 42, the stage measurer 133a sequentially measures the distances to the stage 42 at the measurement points M1 and M2, and the stage measurer 133b sequentially measures the distances to the stage 42 at the measurement points M3 and M4. The measurement results of the stage measurers 133a and 133b are output to the controller 60 by, for example, wireless communication or wired communication. The controller 60 calculates the center position of the stage 42 with respect to the fork 130 based on the measurement results of the stage measurers 133a and 133b.

The number of measurement points on the stage 42 is not limited to the present embodiment. For example, even when there are three measurement points, the controller 60 can calculate the center position of the stage 42. However, when there are four measurement points, the center position of the stage 42 can be calculated more accurately.

Further, the number of stage measurers 133 is not limited to the present embodiment. For example, when the diameter of the stage 42 is known in advance, it is possible that the number of stage measurers 133 may be one. In such a case, the controller 60 can calculate the center position of the stage 42 based on the measurement results of two points of the stage 42 by one stage measurer 133 and the diameter of the stage 42.

Further, the arrangement of the stage measurer 133 is not limited to the present embodiment. For example, the stage measurer 133 may be provided at the proximal ends of the two branched portions in the fork 130. In such a case, a length of the branched portion can be shortened. Then, even when the measurement points of the stage 42 are two points, the center position of the stage 42 can be calculated when the diameter of the stage 42 is known in advance as described above.

The fourth arm 114 also has the same configuration as the third arm 113. That is, the fourth arm 114 includes a fork 140 and a hand 141 as the substrate holder. Further, three wafer measurers 142 and two stage measurers 143 are provided at the fork 140.

<Operation of Wafer Transfer Apparatus>

The wafer transfer apparatus 50 according to the present embodiment is configured as described above. Next, an operation of the wafer transfer apparatus 50 will be described. FIG. 6 is an explanatory diagram illustrating an example of an operation flow of the wafer transfer apparatus 50. In FIG. 6, "LLM 20a" indicates the load lock module 20a, "VTM 40" indicates the transfer module 40, and "PM 41" indicates the processing module 41.

In this example, a case in which the wafer W is loaded into and unloaded from the load lock module 20a and the wafer W is loaded into and unloaded from the processing module 41 will be described. As described above, the distance to the wafer W is measured using the wafer measurers 132 and 142, and the controller 60 calculates the center position of the wafer W. However, in the following, for the sake of simplicity in description, it is described that the wafer measurers 132 and 142 measure the center position of the wafer W. Similarly, as illustrated in FIG. 5, although the distances to the stages 21a, 21b and 42 are measured using the stage measurers 133 and 143, and the controller 60 calculates the center positions of the stages 21a, 21b and 42, in the following, for the sake of simplicity in description, it is described that the stage measurers 133 and 143 measure the center positions of the stages 21a, 21b, and 42.

[Step S1]

First, the fork 130 which does not hold a wafer W receives the unprocessed wafer W from the load lock module 20a. That is, the fork 130 enters into the load lock module 20a. At this time, the center position of the stage 21a is measured using the stage measurer 133. Further, the processed wafer W is held on the fork 140. Then, while the presence or absence of the wafer W is checked using the wafer measurer 142, the center position of the wafer W is measured at the same time, and the wafer W is monitored.

[Step S2]

Next, the position of the fork 130 is corrected based on the measured center position of the stage 21a, and the fork 130 is disposed at a desired position with respect to the stage 21a.

[Step S3]

Next, the wafer W is received from the stage 21a by the fork 130. At this time, since the fork 130 is disposed at a desired position with respect to the stage 21a, the wafer W can be held at an appropriate position of the fork 130. Then, the presence or absence of the wafer W is checked using the wafer measurer 132, and at the same time, the center position of the wafer W is measured, and thereby the monitoring of the wafer W is started.

[Step S4]

Next, the fork 130 in which the wafer W is held is retracted from the load lock module 20a.

[Step S5]

Next, in the transfer module 40, an operation of the fork 130 is changed to an operation of the fork 140, and the processed wafer W which is held by the fork 140 is transferred to the load lock module 20a.

[Step S6]

Next, the fork 140 enters into the load lock module 20a. At this time, the center position of the stage 21a is measured using the stage measurer 143.

[Step S7]

Next, the position of the fork 140 is corrected based on the measured center position of the stage 21a, and the fork 140 is disposed at a desired position with respect to the stage 21a.

[Step S8]

Next, the wafer W is mounted on the stage 21a from the fork 140. At this time, continuing from Step S1, the center position of the wafer W is measured using the wafer measurer 142 as described above. Then, the wafer W is mounted on the stage 21a from the fork 140 so that the center position of the wafer W and the center position of the stage 21a match to each other.

[Step S9]

Next, the fork 140 which does not hold the wafer W is retracted from the load lock module 20a.

[Step S10]

Next, in the transfer module 40, the operation of the wafer transfer apparatus 50 is switched from the loading and unloading of the wafer W into/from the load lock module 20a to the loading and unloading of the wafer W into/from the processing module 41.

[Step S11]

First, the processed wafer W is received from the processing module 41 by the fork 140 which does not hold the wafer W. That is, the fork 140 enters into the processing module 41. At this time, the center position of the stage 42 is measured using the stage measurer 143.

[Step S12]

Next, the position of the fork 140 is corrected based on the measured center position of the stage 42, and the fork 140 is disposed at a desired position with respect to the stage 42.

[Step S13]

Next, the wafer W is received from the stage 42 by the fork 140. At this time, since the fork 140 is disposed at a desired position with respect to the stage 42, the wafer W can be held at an appropriate position of the fork 140. Then, the presence or absence of the wafer W is checked using the wafer measurer 142, and at the same time, the center position of the wafer W is measured, and thereby the monitoring of the wafer W is started.

[Step S14]

Next, the fork 140 in which the wafer W is held is retracted from the processing module 41.

[Step S15]

Next, in the transfer module 40, the operation of the fork 140 is changed to the operation of the fork 130, and the unprocessed wafer W held by the fork 130 is transferred to the processing module 41.

[Step S16]

Next, the fork 130 enters into the processing module 41. At this time, the center position of the stage 42 is measured using the stage measurer 133.

[Step S17]

Next, the position of the fork 130 is corrected based on the measured center position of the stage 42, and the fork 130 is disposed at a desired position with respect to the stage 42.

[Step S18]

Next, the wafer W is mounted on the stage 42 from the fork 130. At this time, continuing from Step S3, the center position of the wafer W is measured using the wafer measurer 132 as described above. Then, the wafer W is mounted on the stage 42 from the fork 130 so that the center position of the wafer W and the center position of the stage 42 match to each other.

[Step S19]

Next, the fork 130 which does not hold the wafer W is retracted from the processing module 41.

[Step S20]

Next, in the transfer module 40, the operation of the wafer transfer apparatus 50 is switched from the loading and unloading of the wafer W into/from the processing module 41 to the loading and unloading of the wafer W into/from the load lock module 20b.

According to the embodiment, when the fork 130 holds the wafer W in Steps S3 to S17, the presence or absence of the wafer W is checked using the wafer measurer 132, and at the same time, the center position of the wafer W is measured, and thereby the wafer W is always being monitored. Similarly, when the fork 140 holds the wafer W in Steps S1 to S7 and S13 to S20, the wafer W is always being monitored. Therefore, the forks 130 and 140 can always appropriately hold the wafer W.

Here, for example, according to a process in the processing module 41, the wafer W may be heated, and in such a case, the wafer W is thermally expanded. In addition, a peripheral edge portion of the wafer W may be removed, or a film may be formed on an upper surface of the wafer W. Since the diameter of the wafer W may change in this way, it is useful to always monitor the center position of the wafer W.

Further, according to the present embodiment, the position of the fork 130 is corrected in Step S2 based on the center position of the stage 21a. Similarly, in Step S12, the position of the fork 140 is corrected based on the center position of the stage 42. Therefore, the wafer W can be received from the stages 21a and 42 at appropriate positions of the forks 130 and 140.

Further, according to the present embodiment, the position of the fork 140 is corrected in Step S7 based on the center position of the stage 21a, and further, in Step S8, the wafer W is mounted on the stage 21a from the fork 140 so that the center position of the wafer W and the center position of the stage 21a match to each other. Similarly, in Step S17, the position of the fork 130 is corrected based on the center position of the stage 42, and further, in Step S18, the wafer W is mounted on the stage 42 from the fork 130 so that the center position of the wafer W and the center position of the stage 42 match to each other. In this way, the wafer W can be mounted at an appropriate position on the stages 21a and 42 from the forks 140 and 130 with high accuracy using both the measurement results of the wafer measurers 132 and 142 and the measurement results of the stage measurers 133 and 143.

Here, for example, according to a process in the processing module 41, heat processing may be performed, and as a result, an exterior of the stage 42 may change or the stage 42 may move. Even in such a case, according to the present embodiment, since the center position of the stage 42 is measured, the wafer W can be mounted at an appropriate position of the stage 42.

The correction of the positions of the forks 130 and 140 in Steps S2, S7, S12 and S17 in the present embodiment may be omitted, for example, when a position difference of the forks 130 and 140 with respect to the stages 21a and 42 is within a predetermined allowable range. In such a case, throughput of the wafer process can be improved.

<Another Embodiment of Operation of Wafer Transfer Apparatus>

Next, another embodiment of the operation of the wafer transfer apparatus 50 will be described.

[Teaching of Wafer Transfer Apparatus]

Figure 7:
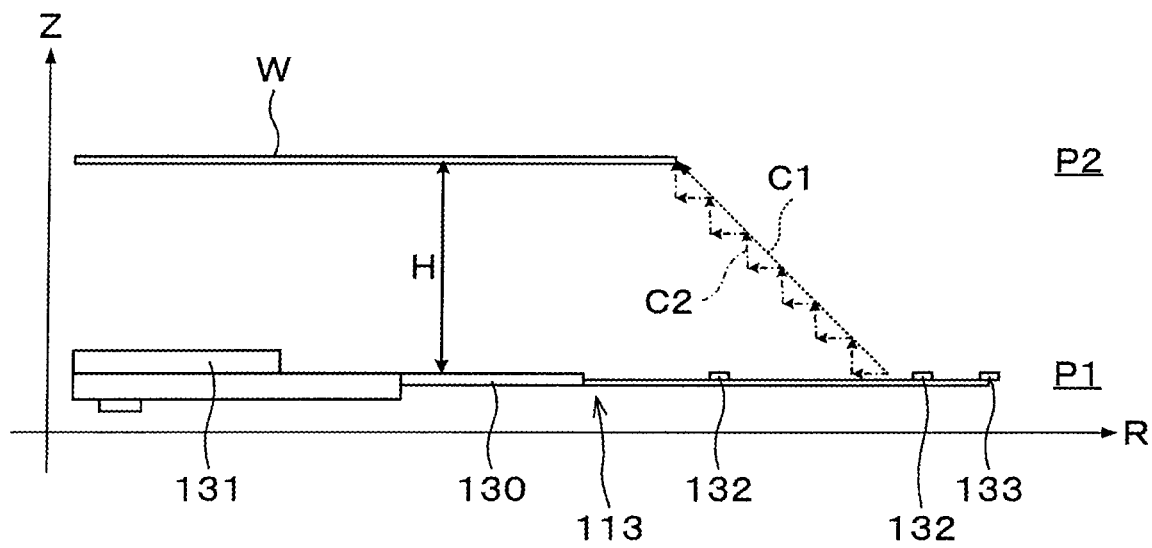
FIG. 7 is an explanatory diagram of an operation of a fork when teaching of the wafer transfer apparatus is performed.

FIG. 7 is an explanatory diagram of the operation of the fork 130 when teaching of the wafer transfer apparatus 50 is performed. In FIG. 7, a Z direction indicates a vertical direction, and an R direction indicates a moving direction of the fork 130 in the horizontal direction. In the teaching of the wafer transfer apparatus 50, when the fork 130 receives the wafer W, a position (a contact position) at which the fork 130 comes into contact with the wafer W is stored.

In conventional teaching, for example, in order to match the center position of the fork with the center position of the wafer, a mark for holding the wafer is attached to the fork, and an operation of the fork when the wafer is held at the mark is stored. However, in this teaching, when the fork is moved in the vertical direction, it is difficult to grasp a distance in the vertical direction from an initial position of the fork to the contact position with the wafer.

Therefore, in the present embodiment, the contact position between the fork 130 and the wafer W is grasped using the wafer measurer 132. First, as illustrated in FIG. 7, in a state in which a transfer arm 100 is extended to the maximum length, the fork 130 and the wafer W are separated from each other, and the fork 130 is disposed at an initial position P1 below the wafer W. Subsequently, the fork 130 is moved in the horizontal direction and the vertical direction, and the fork 130 is brought into contact with the wafer W at a contact position P2. At this time, for example, two movement operations of the fork 130 can be described.

In a first movement operation C1, as illustrated by a dotted line arrow in FIG. 7, a movement speed of the fork 130 in the horizontal direction and a movement speed thereof in the vertical direction are set to be the same and constant. Then, the fork 130 is moved in the horizontal direction and the vertical direction while the center position of the wafer W is measured by the wafer measurer 132. In such a case, the fork 130 and the wafer W can be brought into contact with each other while the center position of the fork 130 and the center position of the wafer W match each other, and the operation of the fork 130 grasping the wafer W at an appropriate position can be reproduced. In this example, the movement speed of the fork 130 in the horizontal direction and the movement speed thereof in the vertical direction are the same, and a movement distance in the horizontal direction and a movement distance in the vertical direction are the same. Then, the distance H in the vertical direction from the initial position P1 of the fork 130 to the contact position P2 can be calculated from the movement distance in the horizontal direction, and thereby the contact position P2 of the fork 130 can be derived.

In addition, in the first movement operation C1, the movement speed of the fork 130 in the horizontal direction and the movement speed thereof in the vertical direction may have a constant ratio and may not be the same. From this ratio, the distance H of the fork 130 in the vertical direction can be calculated.

In a second movement operation C2, as illustrated by an alternate long and short dash line arrow in FIG. 7, the fork 130 is moved alternately in the horizontal direction and the vertical direction in a stepwise manner. For example, one movement distance in the horizontal direction and one movement distance in the vertical direction are the same. Then, the fork 130 is repeatedly moved in the horizontal direction and the vertical direction while the center position of the wafer W is measured by the wafer measurer 132. In such a case, the fork 130 and the wafer W can be brought into contact with each other while the center position of the fork 130 and the center position of the wafer W match to each other, and the operation of the fork 130 grasping the wafer W at an appropriate position can be reproduced. In this example, the movement distance of the fork 130 in the horizontal direction and the movement distance thereof in the vertical direction are the same. Thus, the distance H in the vertical direction from the initial position P1 of the fork 130 to the contact position P2 can be calculated from the movement distance in the horizontal direction, and thereby the contact position P2 of the fork 130 can be derived.

In addition, in the second movement operation C2, the one movement distance of the fork 130 in the horizontal direction and the one movement distance thereof in the vertical direction may have a constant ratio and may not be the same. From this ratio, the distance H of the fork 130 in the vertical direction can be calculated.

As described above, according to the present embodiment, the contact position P2 of the fork 130 with the wafer W can be appropriately grasped using the wafer measurer 132.

[Fork Abnormality Detection]

The teaching method of the wafer transfer apparatus 50 described above can also be applied to detection of abnormality of the fork 130 during a normal operation. For example, when the wafer transfer apparatus 50 is used repeatedly, the position of the fork 130 in the vertical direction may change with time. When a displacement of the fork 130 in the vertical direction exceeds an allowable range, the wafer W cannot be appropriately received by the fork 130. Therefore, it is important to detect such an abnormal state of the fork 130.

Figure 8:
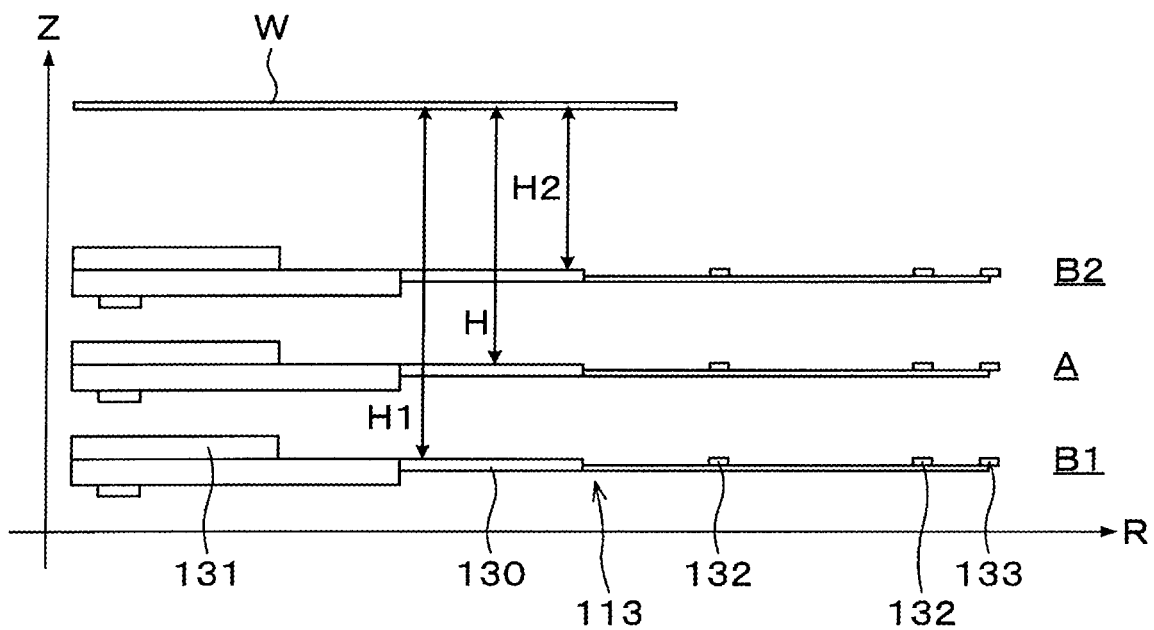
FIG. 8 is an explanatory diagram illustrating a normal state and an abnormal state of the fork.

FIG. 8 is an explanatory diagram illustrating a normal state and an abnormal state of the fork 130. When the initial position of the fork 130 is a normal position A, the distance H to the wafer W in the vertical direction is the same as the distance H in the vertical direction which is derived at the time of the above-described teaching or is within an allowable range from the distance H in the vertical direction. On the other hand, when the initial position of the fork 130 is an abnormal position B1 which is lower than the normal position A, the distance H1 to the wafer W in the vertical direction is beyond the allowable range of the distance H in the vertical direction. Further, when the initial position of the fork 130 is an abnormal position B2 which is higher than the normal position A, the distance H2 to the wafer W in the vertical direction is beyond the allowable range of the distance H in the vertical direction.

Therefore, when the wafer W is received by the fork 130, an operation the same as that of the teaching is performed. That is, in a state in which the fork 130 and the wafer W are separated from each other, the fork 130 is moved in the horizontal direction and the vertical direction while the center position of the wafer W is measured by the wafer measurer 132, and the fork 130 is brought into contact with the wafer W. At this time, as for the movement operation of the fork 130, the movement speed of the fork 130 in the horizontal direction and the movement speed thereof in the vertical direction may be the same and constant as illustrated by a dotted line arrow (the movement operation C1) in FIG. 7, or the fork 130 may be moved alternately in the horizontal direction and the vertical direction in a stepwise manner as illustrated by the alternate long and short dash line arrow (the movement operation C2) in FIG. 7. Then, the displacement of the fork 130 in the vertical direction can be identified by calculating the distance in the vertical direction from the initial position of the fork 130 to the contact position. As a result, it is possible to detect whether the initial position of the fork 130 is normal or abnormal.

[Feedback to Normal Operation]

A result of detecting the abnormality of the fork 130 described above can be fed back to the movement operation of the fork 130 in the normal operation.

Here, in the normal operation, when the wafer W is received by the fork 130, after the fork 130 is moved in the vertical direction at a first movement speed, the fork 130 may be moved in the vertical direction at a second movement speed slower than the first movement speed. The time required for receiving the wafer W can be shortened by moving the fork 130 at the high first movement speed in the first half in this way. On the other hand, in the latter half, it is possible to suppress the bouncing of the wafer W when receiving the wafer W, by moving the fork 130 at the slow second movement speed and receiving the wafer W. However, even though the speed of the fork 130 in the vertical direction is controlled in this way, when the initial position of the fork 130 is abnormal, since the movement speed of the fork 130 when the wafer W is received may be the high first movement speed, the bouncing of the wafer may not be suppressed.

Therefore, as described above, a height position for changing from the first movement speed to the second movement speed is adjusted by calculating the distance in the vertical direction from the initial position of the fork 130 to the contact position and identifying the displacement of the fork 130 in the vertical direction. Specifically, for example, when the initial position of the fork 130 is the abnormal position B1 as illustrated in FIG. 8, a distance in the vertical direction between the abnormal position B1 and the height position for changing from the first movement speed to the second movement speed is longer than that in the normal state. On the other hand, when the initial position of the fork 130 is the abnormal position B2, a distance in the vertical direction between the abnormal position B2 and the height position for changing from the first movement speed to the second movement speed is shorter than that in the normal state.

In this way, it is possible to suppress the bouncing of the wafer W while shortening the time required for receiving the wafer W, by feeding back the result of detecting an abnormality of the fork 130 to the movement operation of the fork 130.

<Another Embodiment of Configuration of Wafer Transfer Apparatus>

Figure 9:
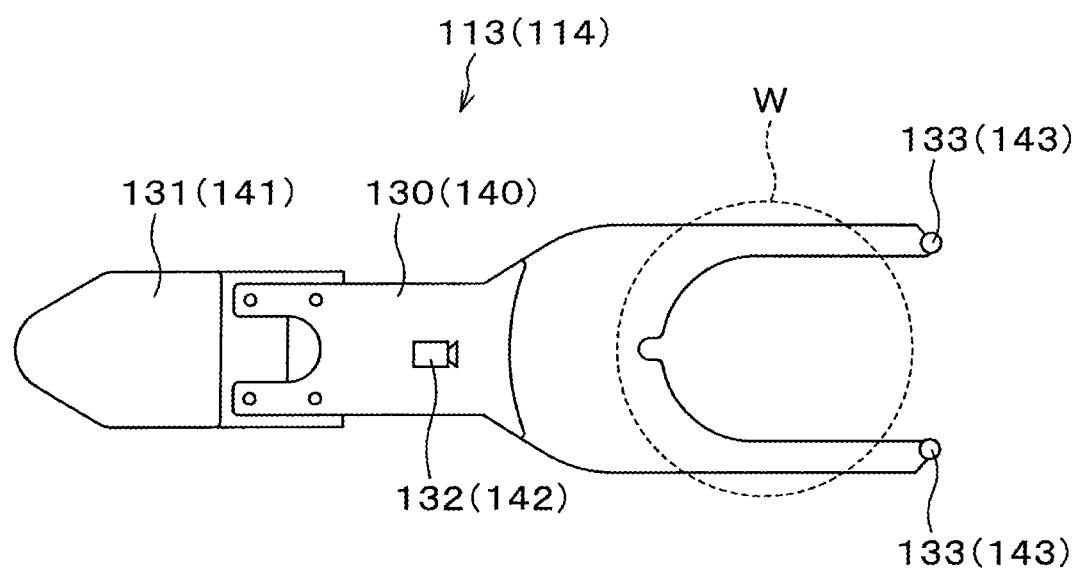
FIG. 9 is a plan view of a third arm and a fourth arm according to another embodiment.
Figure 10:
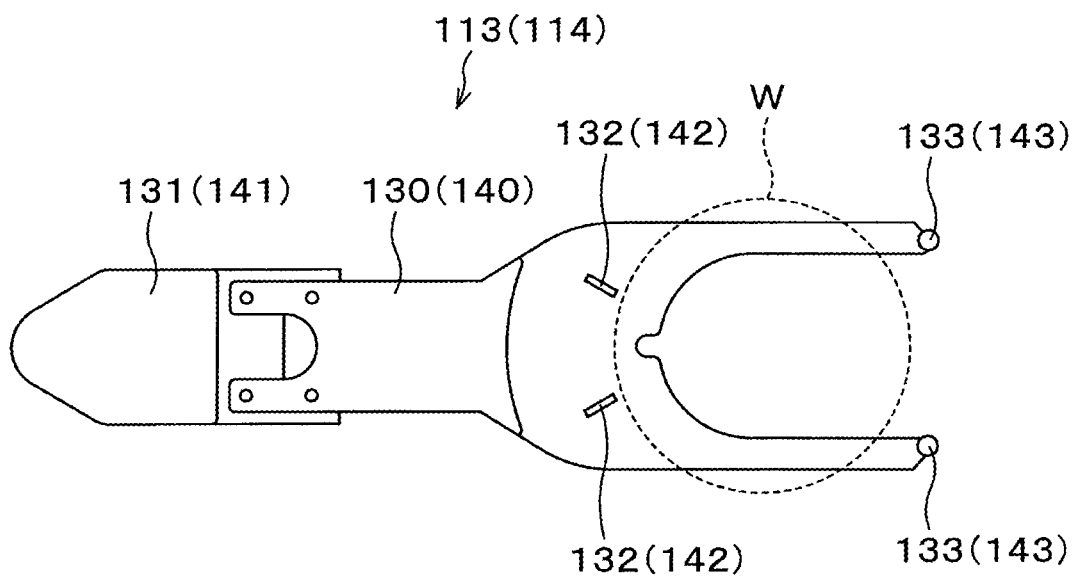
FIG. 10 is a plan view of a third arm and a fourth arm according to still another embodiment.

Next, another embodiment of the configuration of the wafer transfer apparatus 50 will be described. In the forks 130 and 140 of the embodiment, a CMOS line sensor is used for the wafer measurer 132, but the present disclosure is not limited thereto. For example, as illustrated in FIG. 9, a camera as an imager for imaging the wafer W is used for the wafer measurer 132, and the distance from the wafer measurer 132 to the wafer W may be measured based on an image captured by the camera. Alternatively, as illustrated in FIG. 10, a capacitance distance measuring sensor or a white confocal sensor which measures the distance from the wafer measurer 132 to the wafer W may be used for the wafer measurer 132. In any case, the center position of the wafer W with respect to the fork 130 can be measured by measuring the distance between the wafer measurer 132 and the wafer W.

It should be considered that the embodiments disclosed this time are exemplary in all respects and should be considered as being not restrictive. The above embodiments may be omitted, replaced or modified into various forms without departing from the scope of the appended claims and the gist thereof.

What is claimed is:

1. A substrate transfer apparatus for transferring a substrate to a substrate processing apparatus in a reduced pressure atmosphere, the apparatus comprising:
   a substrate holder to hold the substrate;
   a substrate measurer, provided on the substrate holder, to measure a position of the substrate with respect to the substrate holder and a position of the substrate spaced apart from the substrate holder; and
   a controller for controlling the substrate holder and the substrate measurer,
   wherein the controller is configured to:
   when the substrate holder receives the substrate, in a state in which the substrate holder and the substrate are separated from each other, make the substrate holder in contact with the substrate by moving the substrate holder in a horizontal direction and a vertical direction while a position of the substrate is measured by the substrate measurer;
   calculate a distance in the vertical direction between an initial position and a contact position of the substrate holder based on a speed of the substrate holder in the horizontal direction and a speed of the substrate holder in the vertical direction; and
   detect a displacement of the substrate holder by comparing the calculated distance in the vertical direction with a previously obtained normal distance in the vertical direction.

2. The apparatus of claim 1, wherein the substrate measurer comprises a plurality of sensors for measuring a distance to the substrate or an imager for imaging the substrate.

3. The apparatus of claim 1,
   wherein the controller:
   calculates a center position of the substrate with respect to the substrate holder based on a measurement result of the substrate measurer, and
   monitors the substrate based on the center position of the substrate when the substrate holder holds the substrate.

4. The apparatus of claim 1, wherein the substrate processing apparatus comprises a stage on which the substrate is mounted, and wherein the substrate transfer apparatus comprises a stage measurer which is provided on the substrate holder and measures a position of the stage with respect to the substrate holder.

5. The apparatus of claim 4, wherein the stage measurer has a plurality of sensors for measuring a distance to the stage.

6. The apparatus of claim 4,
wherein the controller:
controls the stage measurer,
calculates a center position of the stage with respect to the substrate holder based on a measurement result of the stage measurer, and
corrects a position of the substrate holder based on the center position of the stage.

7. The apparatus of claim 6, wherein the controller:
calculates the center position of the substrate with respect to the substrate holder based on the measurement result of the substrate measurer, and
mounts the substrate on the stage based on the center position of the substrate and the center position of the stage.

8. A substrate processing system for processing a substrate, comprising:
a substrate processing apparatus to process the substrate in a reduced pressure atmosphere; and
a substrate transfer apparatus to transfer the substrate to the substrate processing apparatus in a reduced pressure atmosphere,
wherein the substrate transfer apparatus comprises:
a substrate holder which holds the substrate,
a substrate measurer which is provided on the substrate holder and measures a position of the substrate with respect to the substrate holder and a position of the substrate spaced apart from the substrate holder; and
a controller for controlling the substrate holder and the substrate measurer,
wherein the controller is configured to:
when the substrate holder receives the substrate, in a state in which the substrate holder and the substrate are separated from each other, make the substrate holder in contact with the substrate by moving the substrate holder in a horizontal direction and a vertical direction while a position of the substrate is measured by the substrate measurer;
calculate a distance in the vertical direction between an initial position and a contact position of the substrate holder based on a speed of the substrate holder in the horizontal direction and a speed of the substrate holder in the vertical direction; and
detect a displacement of the substrate holder by comparing the calculated distance in the vertical direction with a previously obtained normal distance in the vertical direction.

9. The system of claim 8,
wherein the controller:
calculates a center position of the substrate with respect to the substrate holder based on a measurement result of the substrate measurer, and
corrects a position of the substrate holder based on the center position of the substrate when the substrate holder receives the substrate.

10. The system of claim 8, wherein the substrate processing apparatus comprises a stage on which the substrate is mounted, and wherein the substrate transfer apparatus comprises a stage measurer which is provided at the substrate holder and measures a position of the stage with respect to the substrate holder.

11. The system of claim 10,
wherein the controller:
controls the stage measurer,
calculates a center position of the stage with respect to the substrate holder based on a measurement result of the stage measurer, and
corrects the position of the substrate holder based on the center position of the stage.

12. The system of claim 11, wherein the controller:
calculates a center position of the substrate with respect to the substrate holder based on a measurement result of the substrate measurer, and
mounts the substrate on the stage based on the center position of the substrate and the center position of the stage.

13. A substrate processing method for processing a substrate using a substrate processing system,
wherein the substrate processing system comprises:
a substrate processing apparatus for processing the substrate in a reduced pressure atmosphere, and
a substrate transfer apparatus for transferring the substrate to the substrate processing apparatus in a reduced pressure atmosphere, and
wherein the substrate processing method comprises: when the substrate is transferred by the substrate transfer apparatus, measuring a position of the substrate with respect to a substrate holder using a substrate measurer provided in the substrate holder while the substrate is held by the substrate holder,
wherein, when the substrate holder receives the substrate, in a state in which the substrate holder and the substrate are separated from each other, the substrate holder is brought into contact with the substrate by moving the substrate holder in a horizontal direction and a vertical direction while a position of the substrate is measured by the substrate measurer,
a distance in the vertical direction between an initial position and a contact position of the substrate holder is calculated based on a speed of the substrate holder in the horizontal direction and a speed of the substrate holder in the vertical direction, and
a displacement of the substrate holder is detected by comparing the calculated distance in the vertical direction with a previously obtained normal distance in the vertical direction.

14. The method of claim 13, wherein a center position of the substrate with respect to the substrate holder is calculated based on a measurement result of the substrate measurer, and
the substrate is monitored based on the center position of the substrate when the substrate holder holds the substrate.

15. The method of claim 13, wherein, when the substrate holder receives the substrate, the substrate holder is moved with respect to the substrate in the vertical direction at a first movement speed, and then the substrate holder is moved in the vertical direction at a second movement speed which is slower than the first movement speed, and
a height position at which the first movement speed is changed to the second movement speed is adjusted based on a detected displacement of the substrate holder.

16. The method of claim 13, wherein, when teaching of the substrate transfer apparatus is performed, in a state in which the substrate holder and the substrate are separated from each other, the substrate holder is brought into contact with the substrate by moving the substrate holder in a horizontal direction and a vertical direction while a position of the substrate is measured by the substrate measurer, and
- a distance in the vertical direction between an initial position and a contact position of the substrate holder is calculated based on a speed of the substrate holder in the horizontal direction and a speed of the substrate holder in the vertical direction, and the contact position of the substrate holder is derived.

17. The method of claim 13, wherein the substrate processing apparatus includes a stage on which the substrate is mounted, and
- wherein, in the substrate processing method, when the substrate transfer apparatus enters into the substrate processing apparatus, a position of the stage with respect to the substrate holder is measured using a stage measurer provided at the substrate holder.

18. The method of claim 17, wherein a center position of the stage with respect to the substrate holder is calculated based on a measurement result of the stage measurer, and
- the position of the substrate holder is corrected based on the center position of the stage.

19. The method of claim 18, wherein a center position of the stage with respect to the substrate holder is calculated based on a measurement result of the stage measurer, and
- the substrate is mounted on the stage based on the center position of the substrate and the center position of the stage.

* * * * *